(12) United States Patent
Xiong

(10) Patent No.: US 7,710,100 B2
(45) Date of Patent: May 4, 2010

(54) MOTHERBOARD TESTING APPARATUS

(75) Inventor: Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 249 days.

(21) Appl. No.: 12/036,270

(22) Filed: Feb. 24, 2008

(65) Prior Publication Data

US 2009/0167316 A1    Jul. 2, 2009

(30) Foreign Application Priority Data

Dec. 28, 2007    (CN) .......................... 2007 1 0203521

(51) Int. Cl.
*G01R 31/28* (2006.01)
*G06F 1/26* (2006.01)

(52) U.S. Cl. ...................... 324/73.1; 324/537; 713/300; 327/398

(58) Field of Classification Search .................. 327/398
See application file for complete search history.

(56) References Cited

U.S. PATENT DOCUMENTS

| 7,346,814 B2 * | 3/2008 | Tsai et al. ...................... 714/55 |
| 2008/0082848 A1 * | 4/2008 | Wang .......................... 713/330 |

* cited by examiner

*Primary Examiner*—Timothy J Dole
*Assistant Examiner*—John Zhu
(74) *Attorney, Agent, or Firm*—Frank R. Niranjan

(57) ABSTRACT

A motherboard testing apparatus for automatically turning on or off a motherboard includes a pulse signal generating circuit for outputting a pulse signal, a first control circuit for outputting a first control signal to an I/O controller on the motherboard according to the pulse signal, and a second control circuit. The first control circuit outputs a low level first control signal when it receives a low level pulse signal, the I/O controller turns the motherboard on when it receives the low level first control signal. The second control circuit outputs a second control signal to the first control circuit which controls the motherboard to turn on again when the first control circuit receives the low level pulse signal a next time.

6 Claims, 1 Drawing Sheet

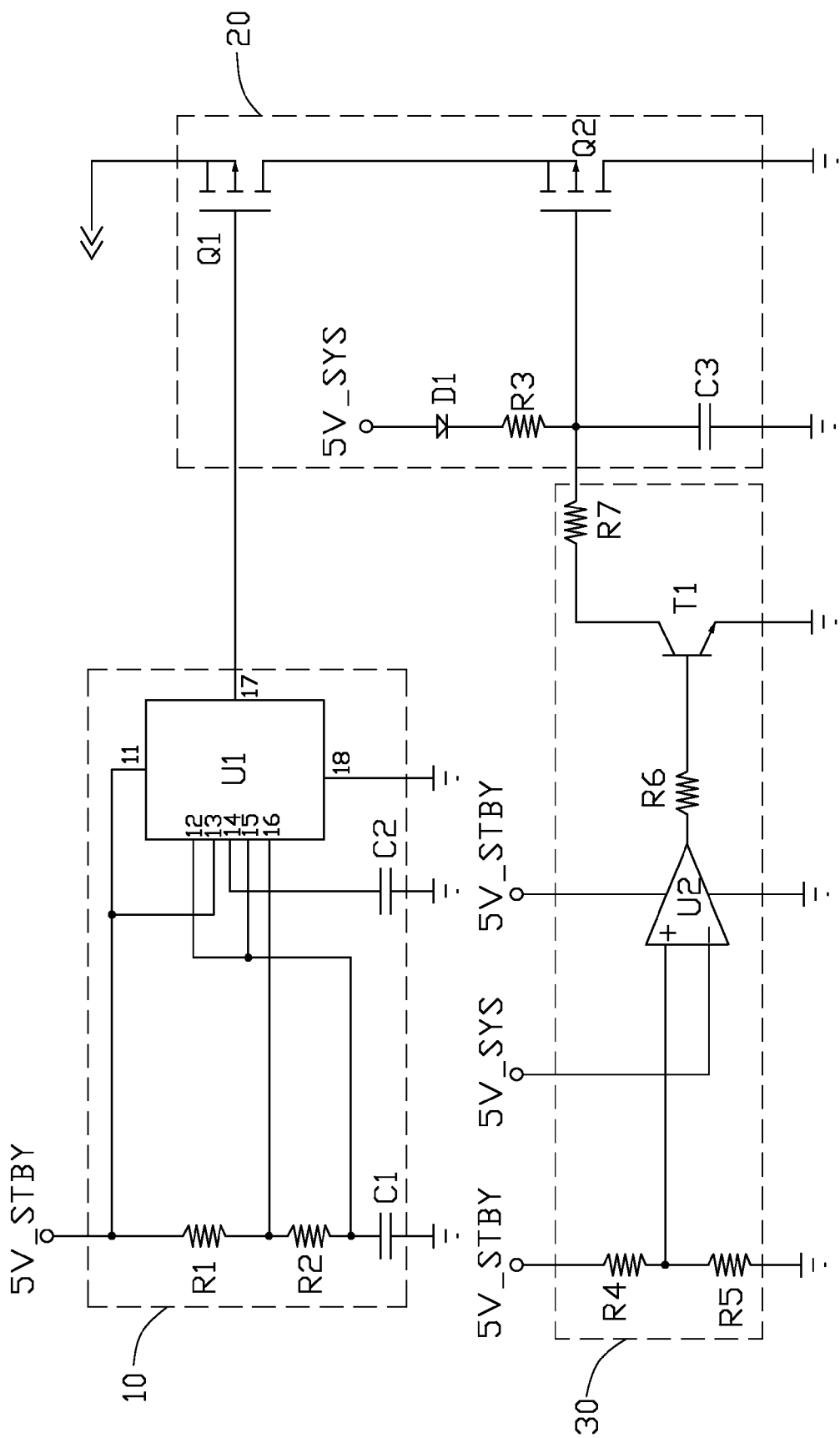

MOTHERBOARD TESTING APPARATUS

BACKGROUND

1. Field of the Invention

The present invention relates to a motherboard testing apparatus, and especially relates to a motherboard testing apparatus for automatically turning on or off a motherboard.

2. Description of Related Art

In computer systems such as personal computer (PC) systems, operators usually need to press a power bottom of the PC system to ground a sixth terminal of a computer front panel header, thereby turning on the computer system, which is inconvenient and time consuming for operators manually performing a motherboard test, in which it is common to power up the motherboard about a thousand times.

What is desired, therefore, is to provide a simple low-cost motherboard testing apparatus for automatically turning on or off a motherboard.

SUMMARY

In one embodiment, a motherboard testing apparatus for automatically turning on or off a motherboard, includes a pulse signal generating circuit, a first control circuit, and a second control circuit. The pulse signal generating circuit has an input terminal for receiving a standby voltage signal, and an output terminal for outputting a pulse signal. The first control circuit has a first input terminal for receiving the pulse signal, a second input terminal, and an output terminal for outputting a first control signal to an I/O controller on the motherboard according to the pulse signal. The first control circuit outputs a low level first control signal when it receives a low level pulse signal, the I/O controller turns the motherboard on when it receives the low level first control signal. The second control circuit has a first input terminal for receiving the standby voltage signal, a second input terminal for receiving a system voltage signal from the motherboard, and an output terminal for outputting a second control signal to the second input terminal of the first control circuit when the motherboard is turned off by software. The second control signal controls the motherboard to turn on again when the first input terminal of the first control circuit receives the low level pulse signal a next time.

Other advantages and novel features of the present invention will become more apparent from the following detailed description of preferred embodiment when taken in conjunction with the accompanying drawing, in which:

BRIEF DESCRIPTION OF THE DRAWINGS

The drawing is a circuit diagram of a motherboard testing apparatus for a motherboard of a computer in accordance with an embodiment of the present invention.

DETAILED DESCRIPTION

Referring to the drawing, a motherboard testing apparatus in accordance with an embodiment of the present invention is provided for controlling on/off of a computer motherboard (not shown). The motherboard testing apparatus includes a pulse signal generating circuit 10, a first control circuit 20, and a second control circuit 30.

The pulse signal generating circuit 10 includes a 555 timer U1, two resistors R1, R2, and two capacitors C1, C2. The 555 timer comprises a power terminal 11, a trigger terminal 12, a resetting terminal 13, a control terminal 14, a threshold terminal 15, a discharge terminal 16, an output terminal 17, and a ground terminal 18. The power terminal 11 and the resetting terminal 13 are coupled to a motherboard to receive a 5 volt standby voltage signal from the motherboard, and are coupled to ground via the resistors R1, R2, and the capacitor C1 connected in series in that order. The trigger terminal 12 and the threshold terminal 15 are coupled to a node between the resistor R2 and the capacitor C1. The control terminal 14 is coupled to ground via the capacitor C2. The discharge terminal 16 is coupled to a node between the resistors R1 and R2.

The first control circuit 20 includes two MOSFETs Q1, Q2, a diode D1, a resistor R3, and a capacitor C3. The gate of the MOSFET Q1 is coupled to the output terminal 17 of the 555 timer U1. The source of the MOSFET Q1 is coupled to an I/O controller (not shown) on the motherboard. The drain of the MOSFET Q1 is coupled to the source of the MOSFET Q2. The gate of the MOSFET Q2 is coupled to ground via the capacitor C3, and is coupled to the cathode of the diode D1 via the resistor R3. The drain of the MOSFET Q2 is coupled to ground. The anode of the diode D1 is coupled to receive a 5 volt system voltage signal from the motherboard.

The second control circuit 30 includes a comparator U2, a transistor T1, and four resistors R4-R7. A non-inverting input terminal of the comparator U2 is coupled to receive the 5 volt standby voltage signal via the resistor R4, and is coupled to ground via the resistor R5. An inverting input terminal of the comparator U2 is coupled to receive the 5 volt system voltage signal. An output terminal of the comparator U2 is coupled to the base of the transistor T1 via the resistor R6. The collector of the transistor T1 is coupled to the gate of the MOSFET Q2 via the resistor R7. The emitter of the transistor T1 is coupled to ground. In this embodiment, the MOSFETs Q1, Q2 are P-channel MOSFETs, the transistor T1 is a NPN transistor.

In use, the motherboard is powered on and outputs the 5 volt standby voltage. The 5 volt standby voltage charges the capacitor C1 via the resistors R1, R2. Before the voltage of the capacitor C1 equals two thirds of the 5 volt standby voltage, the output terminal 17 of the 555 timer U1 continuously outputs a high level signal. When the voltage of the capacitor C1 equals two thirds of the 5 volt standby voltage, the capacitor C1 discharges to the discharge terminal 16 of the 555 timer U1 via the resistor R2, the output terminal 17 of the 555 timer U1 outputs a low level signal. Because the motherboard does not output the 5 volt system voltage signal yet, the gate of the MOSFET Q2 is at a low level and the MOSFET Q2 turns on. So the MOSFET Q1 also turns on and outputs a low level signal to the I/O controller, and the motherboard is powered on. The motherboard outputs the 5 volt system voltage signal and charges the capacitor C3 via the diode D1 and the resistor R3. When the voltage of the capacitor C3 rises to equal a cut-off voltage of the MOSFET Q2, the MOSFET Q2 turns off. The MOSFET Q1 also turns off and outputs a high level signal to the I/O controller.

After the motherboard is on for a predetermined time, a software stored in the computer controls the I/O controller to send a shut down signal to the motherboard. The motherboard turns off and stops outputting the 5 volt system voltage signal. The motherboard still outputs the 5 volt standby voltage signal, and the comparator U2 outputs a high level signal. The transistor T1 turns on, and the capacitor C3 discharges via the resistor R7. When the voltage of the capacitor C3 drops to equal a cut-in voltage of the MOSFET Q2, the MOSFET Q2 turns on. So when the output terminal 17 of the 555 timer U1 outputs a low level signal in a next cycle, the MOSFET Q1 turns on and outputs a low level signal to the I/O controller. The motherboard is powered on again, and so the cycle continues. Therefore, the motherboard is repeatedly powered on and off for as many times as desired.

The motherboard testing apparatus for a motherboard automatically controls the motherboard to power on and off, thereby improving testing efficiency.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A motherboard testing apparatus for automatically turning on or off a motherboard, comprising:
   a pulse signal generating circuit configured for receiving a standby voltage signal at an input terminal, and outputting a pulse signal at an output terminal;
   a first control circuit having a first input terminal for receiving the pulse signal, a second input terminal, and an output terminal for outputting a first control signal to an I/O controller on the motherboard according to the pulse signal, the first control circuit outputs a low level first control signal when it receives a low level pulse signal, the I/O controller turns the motherboard on when it receives the low level first control signal; and
   a second control circuit having a first input terminal for receiving the standby voltage signal, a second input terminal for receiving a system voltage signal from the motherboard, and an output terminal for outputting a second control signal to the second input terminal of the first control circuit when the motherboard is turned off by software, the second control signal controls the motherboard to turn on again when the first input terminal of the first control circuit receives the low level pulse signal a next time.

2. The motherboard testing apparatus as claimed in claim 1, wherein the pulse signal generating circuit comprises a 555 timer, a first resistor, a second resistor, a first capacitor, and a second capacitor, the 555 timer comprises a power terminal, a trigger terminal, a resetting terminal, a control terminal, a threshold terminal, a discharge terminal, and an output terminal, the power terminal acting as the input terminal of the pulse signal generating circuit is coupled to the resetting terminal, and is coupled to ground via the first resistor, the second resistor, and the first capacitor connected in series, the trigger terminal and the threshold terminal are coupled to a node between the second resistor and the first capacitor, the control terminal is coupled to ground via the second capacitor, the discharge terminal is coupled to a node between the first resistor and the second resistor, the output terminal of the 555 timer acting as the output terminal of the pulse signal generating circuit.

3. The motherboard testing apparatus as claimed in claim 2, wherein the first control circuit comprises a first MOSFET, a second MOSFET, a diode, a third resistor, and a third capacitor, the gate of the first MOSFET acting as the first input terminal of the first control circuit is coupled to the output terminal of the 555 timer, the source of the first MOSFET acting as the output terminal of the first control circuit, the drain of the first MOSFET is coupled to the source of the second MOSFET, the gate of the second MOSFET acting as the second input terminal of the first control circuit is coupled to ground via the third capacitor, and is coupled to the cathode of the diode via the third resistor, the drain of the second MOSFET is coupled to ground, the anode of the diode is coupled to receive the system voltage signal.

4. The motherboard testing apparatus as claimed in claim 3, wherein the second control circuit comprises a comparator, a transistor, a fourth resistor, a fifth resistor, a sixth resistor, and a seventh resistor, a non-inverting input terminal of the comparator acting as the first input terminal of the second control circuit is coupled to receive the standby voltage signal via the fourth resistor, and is coupled to ground via the fifth resistor, an inverting input terminal of the comparator acting as the second input terminal of the second control circuit, an output terminal of the comparator is coupled to the base of the transistor via the sixth resistor, the collector of the transistor acting as the output terminal of the second control circuit is coupled to the gate of the second MOSFET via the seventh resistor, the emitter of the transistor is coupled to ground.

5. The motherboard testing apparatus as claimed in claim 3, wherein the first MOSFET and the second MOSFET are P-channel MOSFETs.

6. The motherboard testing apparatus as claimed in claim 4, wherein the transistor is an NPN transistor.

* * * * *